(12) United States Patent
Okuyama

(10) Patent No.: US 9,680,449 B2
(45) Date of Patent: Jun. 13, 2017

(54) ENCODER INPUT DEVICE

(75) Inventor: Takumi Okuyama, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 24 days.

(21) Appl. No.: 14/380,581

(22) PCT Filed: Mar. 2, 2012

(86) PCT No.: PCT/JP2012/055446
§ 371 (c)(1),
(2), (4) Date: Aug. 22, 2014

(87) PCT Pub. No.: WO2013/128642
PCT Pub. Date: Sep. 6, 2013

(65) Prior Publication Data
US 2015/0054669 A1   Feb. 26, 2015

(51) Int. Cl.
| G08C 19/12 | (2006.01) |
| H04L 17/02 | (2006.01) |
| H03K 3/02 | (2006.01) |
| G01D 18/00 | (2006.01) |
| H03K 3/027 | (2006.01) |
| H03K 3/353 | (2006.01) |

(52) U.S. Cl.
CPC ............... H03K 3/02 (2013.01); G01D 18/00 (2013.01); H03K 3/027 (2013.01); H03K 3/353 (2013.01)

(58) Field of Classification Search
CPC ................................ H03K 3/027; H03K 3/353
USPC .................................................. 341/173, 174
See application file for complete search history.

(56) References Cited

U.S. PATENT DOCUMENTS

| 4,100,601 A * | 7/1978 | Kaufman et al. ............... 710/32 |
| 5,267,172 A * | 11/1993 | Vermesse ...................... 705/410 |
| 5,363,405 A * | 11/1994 | Hormel .................... H03K 7/08 |
| | | 307/9.1 |
| 5,699,870 A | 12/1997 | Warren |
| 5,748,675 A * | 5/1998 | Hormel ............... B60R 16/0315 |
| | | 375/219 |

(Continued)

FOREIGN PATENT DOCUMENTS

| JP | 6-38335 U | 5/1994 |
| JP | 8-43147 A | 2/1996 |

(Continued)

OTHER PUBLICATIONS

International Search Report of PCT/JP2012/055446, dated Jun. 5, 2012. [PCT/ISA/210].

(Continued)

*Primary Examiner* — Emily C Terrell
(74) *Attorney, Agent, or Firm* — Sughrue Mion, PLLC; Richard C Turner

(57) ABSTRACT

An encoder input device includes a connection terminal to be connected to one of encoders and made common to a plurality of types of signal systems of the encoders, a plurality of power supplies for signals according to the plurality of types of signal systems of the encoders, and a software switch that switches connection arrangement between the connection terminal and the power supplies for signals in a software manner according to the signal system of the encoder connected to the connection terminal among the plurality of types of signal systems of the encoders.

11 Claims, 6 Drawing Sheets

(56) References Cited

U.S. PATENT DOCUMENTS

| | | | |
|---|---|---|---|
| 8,391,402 B2* | 3/2013 | Laurent | G06F 13/4243 341/50 |
| 2002/0143487 A1 | 10/2002 | Yasuda et al. | |
| 2006/0022851 A1* | 2/2006 | Leung | H02M 3/157 341/51 |
| 2006/0043087 A1* | 3/2006 | Gagas | F24C 15/18 219/391 |
| 2008/0252241 A1* | 10/2008 | Yu et al. | 318/400.14 |
| 2010/0241281 A1* | 9/2010 | Diamond | G01D 5/245 700/295 |

FOREIGN PATENT DOCUMENTS

| | | |
|---|---|---|
| JP | 2002-298276 A | 10/2002 |
| JP | 2008-306332 A | 12/2008 |
| KR | 10-1996-0040775 A | 12/1996 |

OTHER PUBLICATIONS

Communication dated Feb. 26, 2015 from the Taiwanese Intellectual Property Office in counterpart application No. 101128733.

Mahawar, K.; Kumar, Vishal; Gupta, H. 0., "Design and implementation of AMBE based Voice Codec Module over custom FPGA platform," Computing, Communication and Applications (ICCCA), 2012 International Conference, pp. 1,5, Feb. 22-24, 2012.

Dvorkovich, A.Y.; Dvorkovich, V.P.; Mokhin, G.N.; Sokolov, A. Y., "On the implementation of software-only videoconferencing codec on PC," Satellite Communications, 1998. ICSC ' 98. The Third International Conference, pp. 83,84 vol. 1, Sep. 22-24, 1998.

Communication dated Oct. 23, 2015, issued by the Korean Intellectual Property Office in corresponding Korean Application No. 10-2014-7026580.

* cited by examiner

ENCODER INPUT DEVICE

CROSS REFERENCE TO RELATED APPLICATIONS

This application is a National Stage of International Application No. PCT/JP2012/055446 filed Mar. 2, 2012, the contents of all of which are incorporated herein by reference in their entirety.

FIELD

The present invention relates to an encoder input device.

BACKGROUND

Patent Literature 1 describes a testing device for testing an encoder including: three terminals according to three types of encoders of a TTL (Transistor Transistor Logic) level system, an open collector system, and a line driver system; a plurality of LEDs which are connected to the three terminals, respectively; and a switch which is connected to the three terminals. In such a testing device, the switch located on the outside of a housing of the testing device is tilted to a position with which a type of the systems to be tested is associated, the switch is connected to the terminal associated with the type of the system to be tested and thus the LED associated with the type of systems to be tested is lit. Consequently, in accordance with Patent Literature 1, it is possible to quickly confirm which terminals is to be connected with a cable and test a performance of the encoder, thereby determining pass or fail the test.

Patent Literature 2 describes an encoder with a switch for switching an interface, the interface is configured by causing a collector of a transistor to connect to an output terminal as well as connect to a power supply terminal via a switch and a resistor, and causing an emitter of the transistor to connect to a GND terminal to output an encoder signal, and a switching piece of the switch provided at the rear end of a case is tilted to a left side or a right side to open and close the switch. Consequently, in accordance with Patent Literature 2, a function of the interface is altered either for the open collector system or for the TTL system with one encoder.

CITATION LIST

Patent Literature

Patent Literature 1: Japanese Patent Application Laid-Open No. H8-43147

Patent Literature 2: Japanese Utility Model Application Laid-Open No. H6-38335

SUMMARY

Technical Problem

Both the technologies described in Patent Literatures 1 and 2 are considered to relate to a so-called hardware switch in which a plurality of terminals according to a plurality of types of encoders are provided and the switch is physically switched and connected to the terminal according to the type of the encoder.

If an input interface is switched using the hardware switch in an encoder input device to which the encoder should be connected, a plurality of connection terminals are separated in order to input signals of a plurality of types of signal systems. Therefore, when a wire is erroneously laid, it is likely that an excessively large current flows to internal circuits of the encoder input device and consequently the encoder input device may be damaged with broken.

When the input interface is switched using the hardware switch, the plurality of connection terminals are separated in order to input signals of the plurality of types of signal systems. Therefore, the number of connection terminals inside of the encoder as well as the number of terminal pins outside of the encoder increase. It is likely that the encoder input device increases in size as well as in costs.

In the encoder input device that switches a signal system with the hardware switch, the encoder input device side needs to set the hardware switch. Therefore, it is necessary to reset the hardware switch when the encoder input device is exchanged to new one because of a failure or the like. It is likely that the hardware switch is erroneously set.

In light of the foregoing, the present invention has been made to provide an encoder input device that can operate with handling a plurality of types of signal systems of encoders without any hardware switches.

Solution to Problem

According to a scope of the invention, in order to solve the above mentioned problems and achieve the objects of the invention, an encoder input device includes a connection terminal to be connected to one of encoders and made common to a plurality of types of signal systems of the encoders, a plurality of power supplies for signals according to the plurality of types of signal systems of the encoders, and a software switch that switches connection arrangement between the connection terminal and the power supplies for signals in a software manner according to the signal system of the encoder connected to the connection terminal among the plurality of types of signal systems of the encoders.

Advantageous Effects of Invention

In accordance with the present invention, the software switch can switch the connection arrangement between the connection terminal and the power supplies for signals in a software manner according to the signal system of the encoder connected to the connection terminal. Therefore, it is possible to change input impedance of the encoder input device to an appropriate value according to the signal system of the encoder connected to the connection terminal. As a result, the encoder input device can operate according to the plurality of types of signal systems of the encoders without any hardware switches.

DESCRIPTION OF EMBODIMENTS

Embodiments of an encoder input device in accordance with the present invention are described in detail below with reference to drawings. It should be noted that the present invention is not limited thereto.

First Embodiment

Figure 1:
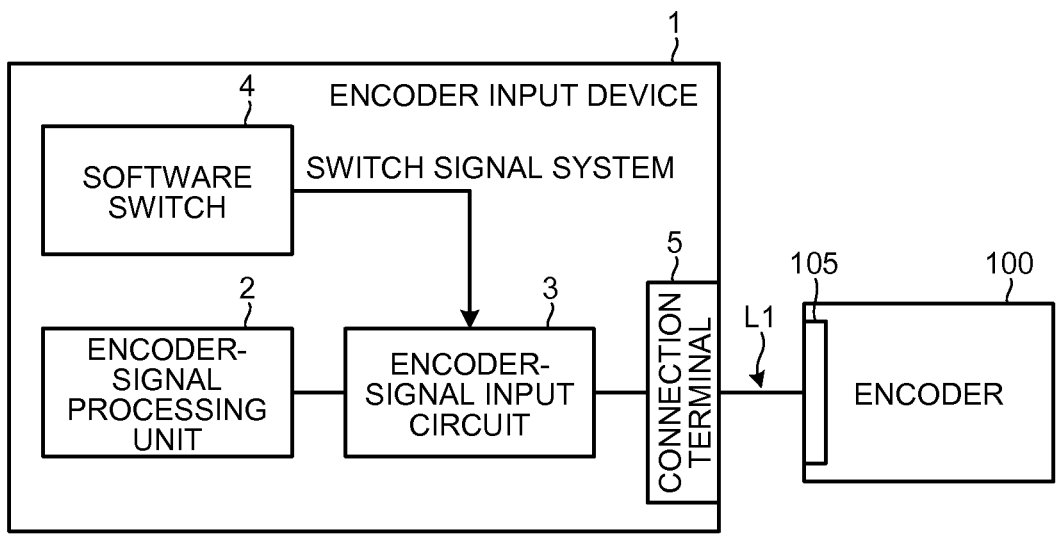
FIG. 1 is a diagram illustrating the configuration of an encoder input device in accordance with a first embodiment.

An encoder input device 1 in accordance with a first embodiment is described with reference to FIG. 1. FIG. 1 is diagram illustrating the configuration of the encoder input device 1.

As shown in FIG. 1, an encoder 100 is connected to the encoder input device 1 via a wire group L1. The encoder 100 detects, for example, the position of a predetermined object (e.g., a rotor of a motor) and supplies a signal (e.g., a pulse signal) indicating the detected position to the encoder input device 1. The encoder input device 1 processes the signal indicating the detected position and controls, according to a result of the processing, the position of the predetermined object (e.g., the rotor of the motor) via a predetermined control circuit (e.g., an inverter circuit for driving the motor).

There is a case where encoders 100a to 100c of a plurality of types of signal systems that are different from one another are connected to the encoder input device 1. If the encoder input device 1 corresponds to one signal system and an encoder of a signal system different from the one signal system is connected to the encoder input device 1, it is likely that the encoder input device 1 may be damaged with broken.

Therefore, in this embodiment, the encoder input device 1 includes a configuration according to the types of signal systems of the encoders and performs a switching operation according to the types of signal systems of the encoders connected to the encoder input device 1.

Specifically, as shown in FIG. 1, the encoder input device 1 includes a connection terminal 5, an encoder-signal input circuit 3, an encoder-signal processing unit 2, and a software switch 4.

The encoder 100 is connected to the connection terminal 5 via the wire group L1. The connection terminal 5 supplies a pulse signal supplied from the encoder 100 via the wire group L1 to the encoder-signal input circuit 3. The connection terminal 5 is made common to the plurality of types of signal systems of the encoders (see FIG. 4 to FIG. 6). The plurality of types of signal systems of the encoders includes, for example, at least two systems of a differential system, a TTL (Transistor Transistor Logic) system, and an open collector system.

Specifically, an output terminal 105, which outputs a signal via the wire group L1, is provided in the encoder 100. The connection terminal 5 corresponds to the output terminal 105. For example, a terminal 51 in the connection terminal 5 is connected to a terminal 151 in the output terminal 105 via a wire L11. For example, a terminal 52 in the connection terminal 5 is connected to a terminal 152 in the output terminal 105 via a wire L12. For example, a terminal 53 in the connection terminal 5 is connected to a terminal 153 in the output terminal 105 via a wire L13.

Figure 4:
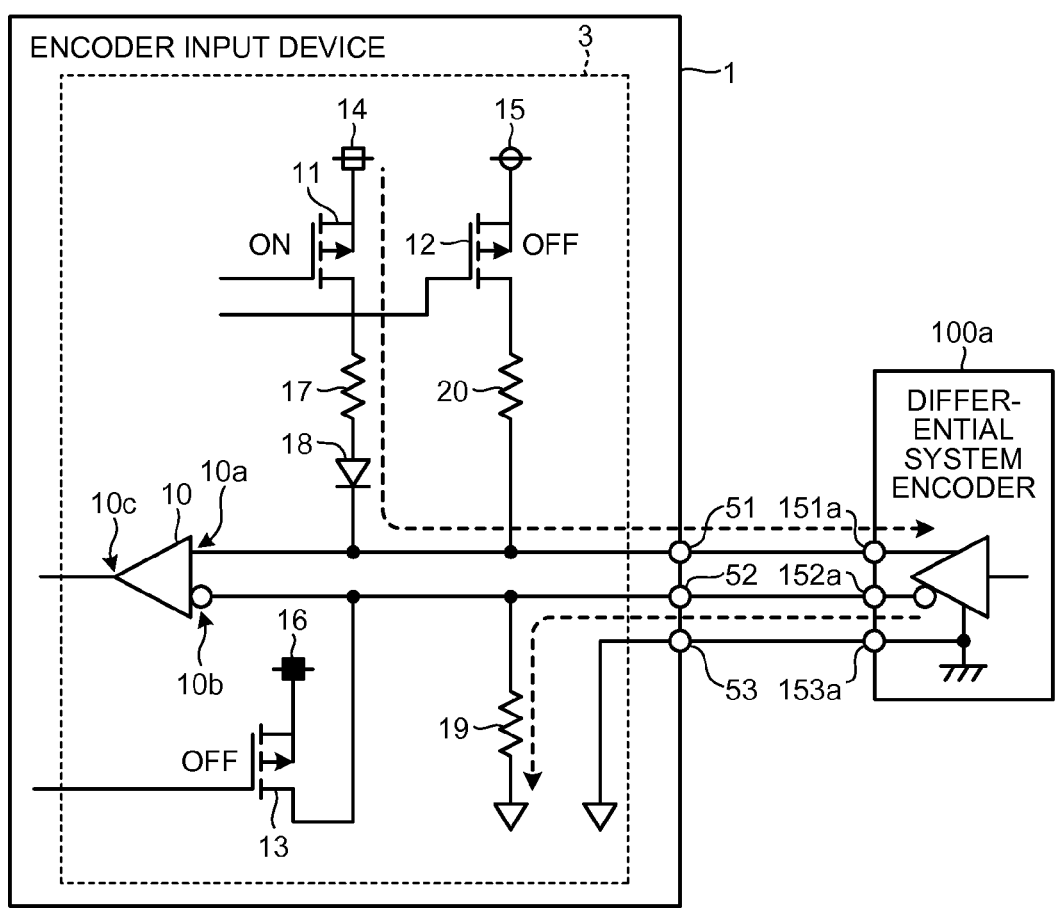
FIG. 4 is a diagram illustrating the operation of the encoder-signal input circuit in the first embodiment.
Figure 5:
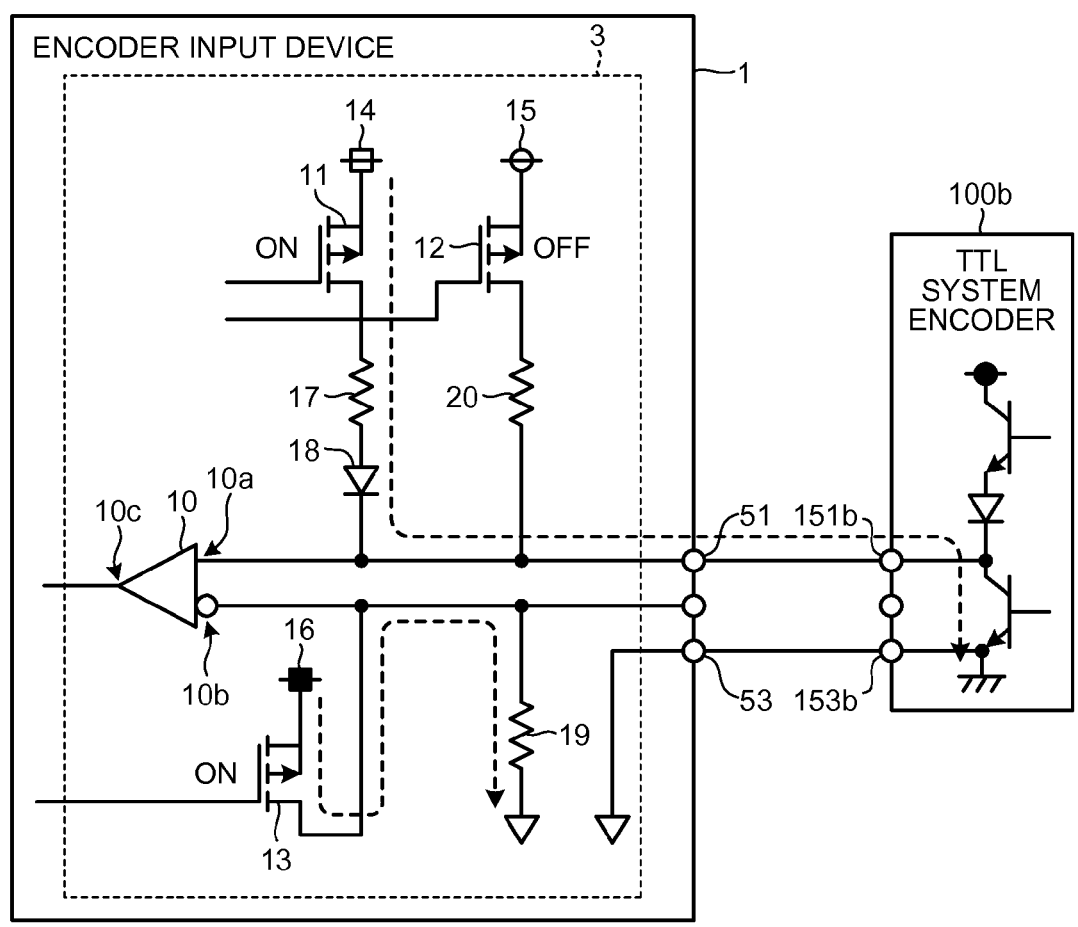
FIG. 5 is a diagram illustrating the operation of the encoder-signal input circuit in the first embodiment.
Figure 6:
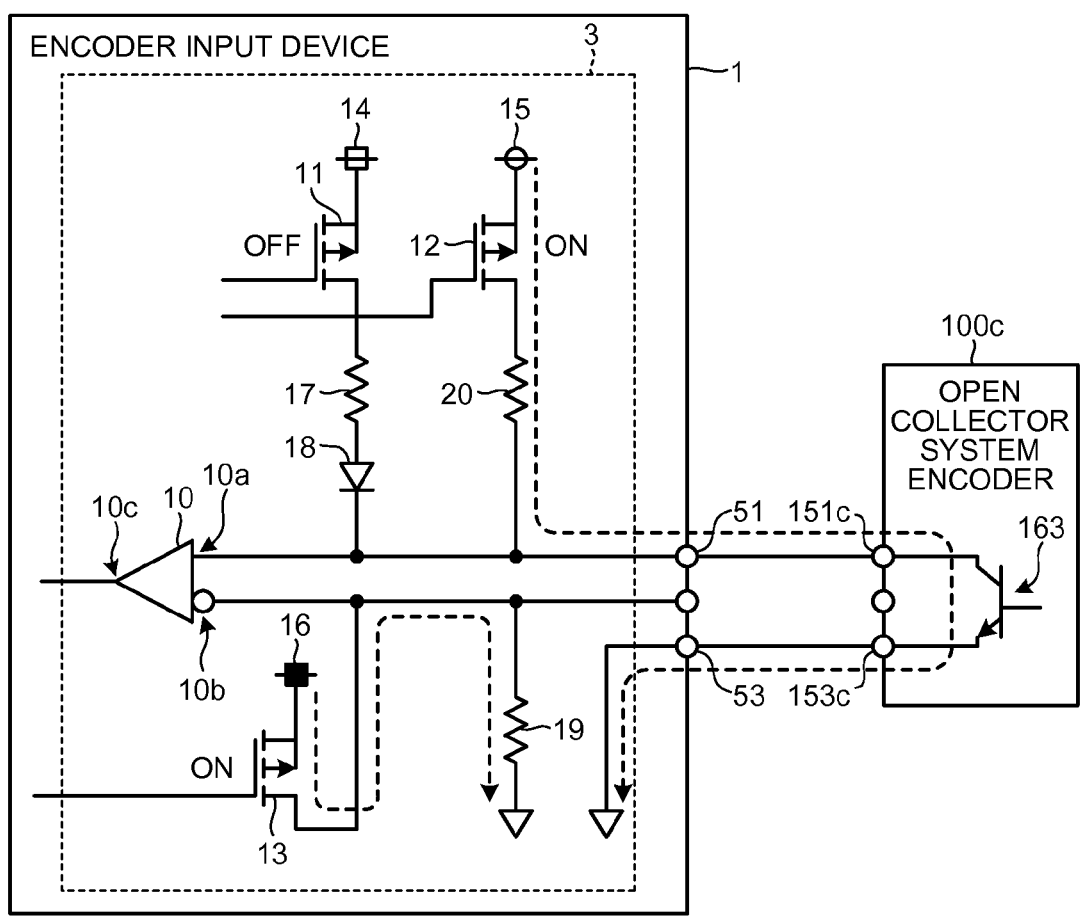
FIG. 6 is a diagram illustrating the operation of the encoder-signal input circuit in the first embodiment.

It should be noted that although there is a case where a form of the output terminal 105 is sometimes partially different from otherwise according to the types of signal systems of the encoders (e.g., the wire L12 and the terminal 152 are sometimes omitted), the connection terminal 5 is made common to all forms of the output terminal 105 in the types of signal systems of the encoders (see FIG. 4 to FIG. 6).

The encoder-signal input circuit 3 is connected to the connection terminal 5, the encoder-signal processing unit 2, and the software switch 4. Although the configuration of the encoder-signal input circuit 3 is made common to the plurality types of signal systems of the encoders, the operation of the encoder-signal input circuit 3 is switched according to the types of signal systems of the encoders (see FIG. 4 to FIG. 6).

The encoder-signal input circuit 3 receives a pulse signal from the connection terminal 5. The encoder-signal input circuit 3 converts a level of the pulse signal to a level suitable for signal processing in the encoder-signal processing unit 2. The encoder-signal input circuit 3 supplies the converted pulse signal to the encoder-signal processing unit 2.

The encoder-signal processing unit 2 is connected to the encoder-signal input circuit 3. The encoder-signal processing unit 2 receives the converted pulse signal from the encoder-signal input circuit 3. The encoder-signal processing unit 2 counts the number of pulses of the converted pulse signal and derives a position of the predetermined object according to a result of the counting. The encoder-signal processing unit 2 controls, according to the derived position, the position of the predetermined object with the predetermined control circuit.

The software switch 4 is connected to the encoder-signal input circuit 3. The software switch 4 is connected to a user interface (not shown in the figure; e.g., a keyboard, a mouse, or a touch panel) so as to communicate with the user interface which is provided on the outside or the inside of the encoder input device 1.

When the software switch 4 receives, via the user interface, for example, information concerning the encoder 100 connected to the encoder input device 1, the software switch 4 specifies, on the basis of the information concerning the encoder 100, a signal system of the encoder 100 connected to the connection terminal 5. The software switch 4 generates, according to the specified signal system, commands for switching the signal system.

Figure 2:
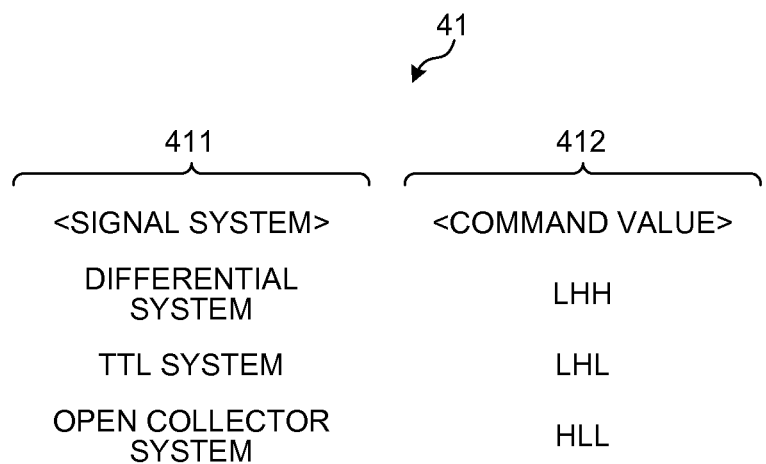
FIG. 2 is a diagram illustrating data structure of a conversion table in the first embodiment.

For example, the software switch 4 includes a conversion table 41 in which a plurality of types of signals systems of encoders are associated with a plurality of command values, respectively. For example, as shown in FIG. 2, the conversion table 41 includes a signal system column 411 and command values column 412. In the signal system column 411, as the types of signals systems of the encoders, for example, the differential system, the TTL system, and the open collector system are stored. In the command values column 412, as the command values, for example, LHH, LHL, and HLL are stored. It is possible to specify the command values according to the signal system of the encoder by referring to the conversion table 41.

For example, the software switch 4 receives information concerning the signal system of the encoder 100 connected to the encoder input device 1 and generates, on the basis of the information and the conversion table 41, the commands for switching the signal system.

The software switch 4 supplies the commands for switching the signal system (a control signal) to the encoder-signal input circuit 3. That is, the software switch 4 controls the encoder-signal input circuit 3 in a software manner by supplying the commands for switching the signal system (the control signal) to the encoder-signal input circuit 3. For example, the software switch 4 switches an electric connection arrangement in the encoder-signal input circuit 3 in a software manner (without physically switching the configuration) according to the signal system of the encoder 100 connected to the connection terminal 5 among the types of signal systems of the encoders.

Figure 3:
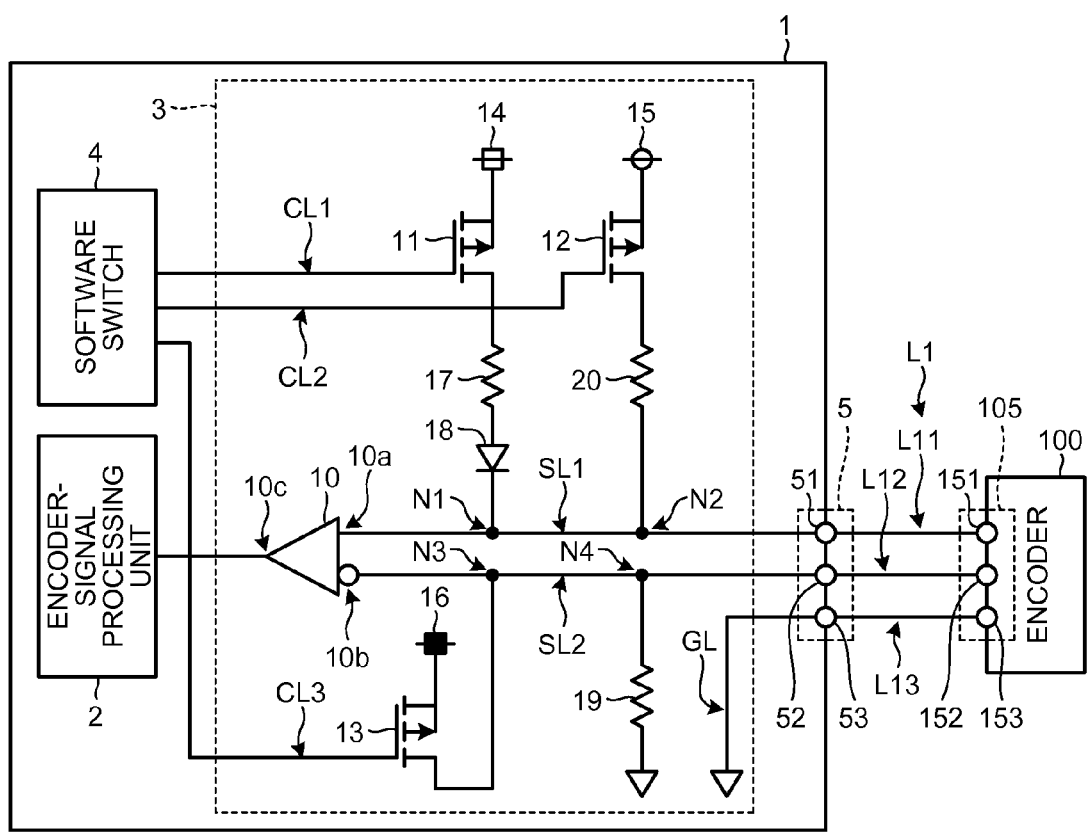
FIG. 3 is a diagram illustrating the configuration of an encoder-signal input circuit in the first embodiment.

The internal connection arrangement of the encoder-signal input circuit 3 is described with reference to FIG. 3. FIG. 3 is a diagram illustrating the internal connection arrangement of the encoder-signal input circuit 3.

The encoder-signal input circuit 3 includes a differential receiver 10, FETs (field effect transistors) 11, 12, and 13, power supplies for signals 14, 15, and 16, resistors 17, 19, and 20, a rectifier diode 18, signal lines SL1 and SL2, and a ground line GL.

A non-inverting input terminal 10a of the differential receiver 10 is connected to the terminal 51 via the signal line SL1. An inverting input terminal 10b of the differential receiver 10 is connected to the terminal 52 via the signal line SL2. An output terminal 10c of the differential receiver 10 is connected to the encoder-signal processing unit 2.

The FET 11 is, for example, a PMOS transistor. A source of the FET 11 is connected to the power supply for signals 14. A drain of the FET 11 is connected to the resistor 17. A gate of the FET 11 is connected to the software switch 4 via a control line CL1. The FET 11 turns on upon a control signal with an active level (e.g., a control signal at an L level) is supplied to the gate of the FET 11. The FET 11 turns off upon a control signal with a non-active level (e.g., a control signal at an H level) is supplied to the gate of the FET 11.

The FET 12 is, for example, a PMOS transistor. A source of the FET 12 is connected to the power supply for signals 15. A drain of the FET 12 is connected to the resistor 20. A gate of the FET 12 is connected to the software switch 4 via a control line CL2. The FET 12 turns on upon a control signal with the active level (e.g., a control signal at the L level) is supplied to the gate of the FET 12. The FET 12 turns off upon a control signal with the non-active level (e.g., a control signal at the H level) is supplied to the gate of the FET 12.

The FET 13 is, for example, a PMOS transistor. A source of the FET 13 is connected to the power supply for signals 16. A drain of the FET 13 is connected to the signal line SL2 at a node N3. A gate of the FET 13 is connected to the software switch 4 via a control line CL3. The FET 13 turns on upon a control signal with the active level (e.g., a control signal at the L level) is supplied to the gate of the FET 13. The FET 13 turns off upon a control signal with the non-active level (e.g., a control signal at the H level) is supplied to the gate of the FET 13.

The power supplies for signals 14, 15, and 16 each supply power supply voltages.

One end of the resistor (a limiting resistor) 17 is connected to the FET 11. The other end of the resistor 17 is connected to the signal line SL1 at a node N1 via the rectifier diode 18. The resistor 17 limits an amount of an electric current flowing from the power supply for signal 14 to the node N1 upon the FET 11 turns on.

One end of the resistor (a pull-down resistor) 19 is connected to a signal line SL2 at a node N4. The other end of the resistor 19 is connected to the ground potential. Upon the FET 13 turns off, the resistor 19 adjusts (pulls down) the potential at the node N4 to, for example, the ground potential.

One end of the resistor (a pull-up resistor) 20 is connected to the FET 12. The other end of the resistor 20 is connected to the signal line SL1 at a node N2. When a transistor 163 (see FIG. 6) of the open collector system encoder 100c turns off, the resistor 20 adjusts (pulls up) the potential at the node N2 to, for example, potential near the potential of the power supply for signal 15.

An anode of the rectifier diode 18 is connected to the resistor 17. A cathode of the rectifier diode 18 is connected to the signal line SL1 at the node N1.

The signal line SL1 connects the non-inverting input terminal 10a of the differential receiver 10 with the terminal 51 of the connection terminal 5. The signal line SL1 transmits a signal supplied via the terminal 51 to the non-inverting input terminal 10a.

The signal line SL2 connects the inverting input terminal 10b of the differential receiver 10 with the terminal 52 of the connection terminal 5. The signal line SL2 transmits a signal supplied via the terminal 52 to the inverting input terminal 10b.

The ground line GL connects the ground potential with the terminal 53 in the connection terminal 5.

In the encoder-signal input circuit 3, a signal from the encoder 100 is received with the differential receiver 10. Three types of power supplies for signals 14, 15, and 16 are connected to the signal lines SL1 and SL2 on the input side of the differential receiver 10 by means of the FETs 11, 12, and 13. The power supplies for signals 14 to 16 to be connected can be switched in accordance with ON/OFF of the FETs 11 to 13. Two signal lines and the ground line are assigned to the connection terminal 5. Two or three signal lines may be used as wires according to the signal system of the encoder 100.

The operations of the encoder-signal input circuit 3 according to the three types of signal systems, which include the differential system, the TTL system, and the open collector system are described in the stated order.

First, the operation of the encoder-signal input circuit 3 when the differential system is selected is described.

For example, when the software switch 4 shown in FIG. 3 receives information indicating that the signal system of the encoder 100 connected to the encoder input device 1 is the differential system, the software switch 4 generates command values ($\phi$CL1, $\phi$CL2, $\phi$CL3)=(L, H, H) on the basis of the information and the conversion table 41 (see FIG. 2). The software switch 4 supplies a control signal $\phi$CL1 with the L level potential to the FET 11 through the control line CL1, supplies a control signal $\phi$CL2 with the H level potential to the FET 12 through the control line CL2, and supplies a control signal $\phi$CL3 with the H level potential to the FET 13 through the control line CL3.

In response to the supply of the control signals, as shown in FIG. 4, the FET 11 turns on and the FETs 12 and 13 turn off. A + terminal 151a of the differential system encoder 100a and the + terminal 51 of the encoder input device 1, and a − terminal 152a of the differential system encoder 100a and the − terminal 52 of the encoder input device 1 are respectively interconnected. A ground terminal 153a of the differential system encoder 100a and the ground terminal 53 of the encoder-input device 1 are interconnected. An output of the differential system encoder 100a has two kinds of operation states, i.e., an operation state in which the + terminal 151a is H and the − terminal 152a is L and an operation state in which the + terminal 151a is L and the − terminal 152a is H.

In the former case, very little electric current flows through both the signal lines SL1 and SL2. H potential appears at the non-inverting input terminal 10a of the differential receiver 10, L potential appears at the inverting input terminal 10b of the differential receiver 10, and H potential appears at the output terminal 10c of the differential receiver 10.

On the other hand, in the latter case, as indicated by a broken line arrow, an electric current flows from the power supply for signal 14 (e.g., 5 volts) to the + terminal 151a of the differential system encoder 100a via the FET 11, the limiting resistor 17, and the rectifier diode 18. An electric current flows from the − terminal 152a of the differential system encoder 100a to the ground potential via the pull-down resistor 19. A short circuit is prevented from being formed with the limiting resistor 17 and the pull-down resistor 19. L potential appears at the non-inverting input terminal 10a of the differential receiver 10, H potential appears at the inverting input terminal 10b, and L potential appears at the output terminal 10c of the differential receiver 10.

In this way, output signals at different potential levels can be output from the differential receiver 10 according to each of the two kinds of operation states of the differential system encoder 100a.

The operation of the circuit when the TTL system is selected is described.

For example, when the software switch 4 shown in FIG. 3 receives information indicating that the signal system of the encoder 100 connected to the encoder input device 1 is the TTL system, the software switch 4 generates command values (φCL1, φCL2, φCL3)=(L, H, L) on the basis of the information and the conversion table 41 (see FIG. 2). The software switch 4 supplies the control signal φCL1 with the L level potential to the FET 11 through the control line CL1, supplies the control signal φCL2 with the H level potential to the FET 12 through the control line CL2, and supplies the control signal φCL3 with the L level potential to the FET 13 through the control line CL3.

In response to the supply of the control signals, as shown in FIG. 5, the FETs 11 and 13 turn on and the FET 12 turns off. The signal terminal 151b of a TTL system encoder 100b and the + terminal 51 of the encoder input device 1 are interconnected. The ground terminal 153b of the TTL system encoder 100b and the ground terminal 53 of the encoder input device 1 are interconnected. Because an electric current flows from the power supply for signal (a reference power supply) 16 to the ground via the FET 13 and the pull-down resistor 19, potential appears at the inverting input terminal 10b of the differential receiver 10, which is substantially the same as the voltage of the power supply for signal 16. The amount of voltage of the power supply for signal 16 is smaller than 2 volts, which is a minimum value of H potential of a general TTL, and larger than 0.8 V, which is a maximum value of L potential of the general TTL. An output of the TTL system encoder 100b has two kinds of operation states, which include an operation state in which the potential at the signal terminal 151b is H and an operation state in which the potential at the signal terminal 151b is L.

In the former case, very little electric current flows via the signal terminal 151b of the TTL system encoder 100b. H potential appears at the non-inverting input terminal 10a of the differential receiver 10. Because the potential at the inverting input terminal 10b of the differential receiver 10 is lower than the H potential, the non-inverting input terminal 10a of the differential receiver 10 has potential higher than the potential at the inverting input terminal 10b. Therefore, H potential appears at the output terminal 10c of the differential receiver 10.

On the other hand, in the latter case, an electric current flows from the power supply for signal 14 (e.g., 5 volts) to the TTL system encoder 100b through the FET 11, the limiting resistor 17, and the rectifier diode 18. L potential appears at the non-inverting input terminal 10a of the differential receiver 10. Because the potential at the inverting input terminal 10b of the differential receiver 10 is higher than the L potential, the non-inverting input terminal 10a of the differential receiver 10 has potential lower than the potential at the inverting input terminal 10b. Therefore, L potential appears at the output terminal 10c of the differential receiver 10.

In this way, output signals at different potential levels can be output from the differential receiver 10 according to each of the two kinds of operation states of the TTL system encoder 100b.

Lastly, the operation of the circuit when the open collector system is selected is described.

For example, when the software switch 4 shown in FIG. 3 receives information indicating that a signal system of the encoder 100 connected to the encoder input device 1 is the open collector system, the software switch 4 generates command values (φCL1, φCL2, φCL3)=(H, L, L) on the basis of the information and the conversion table 41 (see FIG. 2). The software switch 4 supplies the control signal φCL1 with the H level potential to the FET 11 through the control line CL1, supplies the control signal φCL2 with the L level potential to the FET 12 through the control line CL2, and supplies the control signal φCL3 with the L level potential to the FET 13 through the control line CL3.

In response to the supply of the control signals, as shown in FIG. 6, the FETs 12 and 13 turn on and the FET 11 turns off. A collector terminal 151c of the open collector system encoder 100c and the + terminal 51 of the encoder input device 1 are interconnected. An emitter terminal 153c of the open collector system encoder 100c and the ground terminal 53 of the encoder input device 1 are interconnected. Because an electric current flows from the power supply for signal (the reference power supply) 16 to the ground through the FET 13 and the pull-down resistor 19, potential appears at the inverting input terminal 10b of the differential receiver 10, which is substantially the same as the voltage of the power supply for signal 16. As described above, the amount of voltage of the power supply for signal 16 is smaller than 2 volts, which is the minimum value of H potential of the general TTL, and larger than 0.8 V, which is the maximum value of L potential of the general TTL. The amount of voltage of the power supply for signal (a power supply for the open collector system) 15 is higher than 5 volts of the TTL system. An output of the open collector system encoder 100c has two kinds of operation states, which include an operation state in which the transistor 163 in the encoder turns off and an operation state in which the transistor 163 turns on.

In the former case, the collector of the transistor 163 is open. The rectifier diode 18 is inserted to prevent an electric current from flowing into the power supply for signal 14 (e.g., 5 volts) from the power supply for signal 15. Therefore, the potential at the non-inverting input terminal 10a of the differential receiver 10 is substantially equal to the potential of the power supply for signal 15. The potential at the inverting input terminal 10b of the differential receiver 10 is substantially equal to the potential of the power supply for signal 16 and lower than the voltage of the power supply for signal 15. Therefore, the non-inverting input terminal 10a of the differential receiver 10 has a voltage higher than the voltage at the inverting input terminal 10b. Therefore, H potential appears at the output terminal 10c of the differential receiver 10.

On the other hand, in the latter case, an electric current flows from the power supply for signal (the power supply for the open collector system) 15 to the ground via the transistor 163 through the FET 12 and the pull-up resistor 20. Therefore, the potential at the non-inverting input terminal 10a of the differential receiver 10 is substantially equal to the ground potential. Because the potential at the inverting input terminal 10b of the differential receiver 10 is substantially the same as the potential of the power supply for signal (the reference power supply) 16 and higher than the ground potential, the non-inverting input terminal 10a of the differential receiver 10 has voltage lower than the voltage at the inverting input terminal 10b. Therefore, L potential appears at the output terminal 10c of the differential receiver 10.

In this way, output signals at different potential levels can be output from the differential receiver 10 according to each of the two kinds of operation states of the open collector system encoder 100c.

It should be noted that an initial state of ON/OFF of the FETs 11, 12, and 13 is set in the differential system in which the voltage is the lowest among the three systems. Alternatively, all the FETs are initially set to turn off. Consequently, when each of the encoders that have settings different from each other is connected, for example, during startup of the system, it is possible to prevent the encoder input device and the encoder from being damaged with broken.

As described above, in the first embodiment, the software switch 4 switches the connection arrangement between the connection terminal 5 and the power supplies for signals 14 to 16 in a software manner according to the signal system of the encoder connected to the connection terminal 5 among the types of signal systems of the encoders. Consequently, it is possible to switch input impedance of the encoder input device 1 to an appropriate potential value according to the signal system of the encoder connected to the connection terminal 5. Therefore, the encoder input device 1 can operate according to the types of signal systems of the encoders without any hardware switches.

In the first embodiment, the signal system is switched by the software switch 4. Therefore, it is easy to change the signal system. It is possible to save an effort and a time for resetting the encoder input device 1 and reduce possibility of occurrence of the erroneous setting when the encoder input device 1 is exchanged.

In the first embodiment, connection terminals of a plurality of types of signal systems can be combined into one terminal by switching an internal circuit with the software switch. That is, the connection terminal 5 is made common to the plurality of types of signal systems of the encoders. For example, in the wiring to the encoders of the three types of systems, the ground terminal 53 of the encoder input device 1 is connected to the ground terminals 153a and 153b or the emitter terminal 153c of the encoders 100a to 100c (see FIG. 4 to FIG. 6). The + terminal 51 of the encoder input device 1 is connected to the + terminal 151a, the signal terminal 151b, or the collector terminal 151c of the encoders 100a to 100c (see FIG. 4 to FIG. 6). Therefore, a plurality of + terminals according to voltage levels of signals are not necessary. Therefore, it is simple to interconnect the terminals. It is possible to reduce possibility of occurrence of erroneous wiring. Therefore, it is possible to suppress breakage of the encoder input device and the encoder due to the erroneous wiring.

In the first embodiment, the connection terminal 5 is made common to the plurality of the types of signal systems of the encoders. That is, it is possible to handle encoders of a plurality of systems having different input impedances by providing a common terminal pin not individually providing terminal pins according to the systems. Therefore, it is possible to reduce the number of terminal pins. Consequently, it is possible to achieve a reduction in manufacturing cost and the size of the encoder input device.

In the first embodiment, because the encoders of a plurality of the types of signal systems are handled by the common terminal pin, even when a user replaces an encoder with another encoder of a different signal system, pin assignment of the encoder input device does not change. Therefore, it is possible to save a time to work.

Second Embodiment

An encoder input device 1i in accordance with a second embodiment is described. In the following description, the points different from the first embodiment are mainly described.

Although in the first embodiment, a signal system is reset when the encoder input device 1 is exchanged to new one because of a failure or the like of the encoder input device 1, in the second embodiment, a signal system does not have to be reset when the encoder input device 1i is exchanged.

Figure 7:
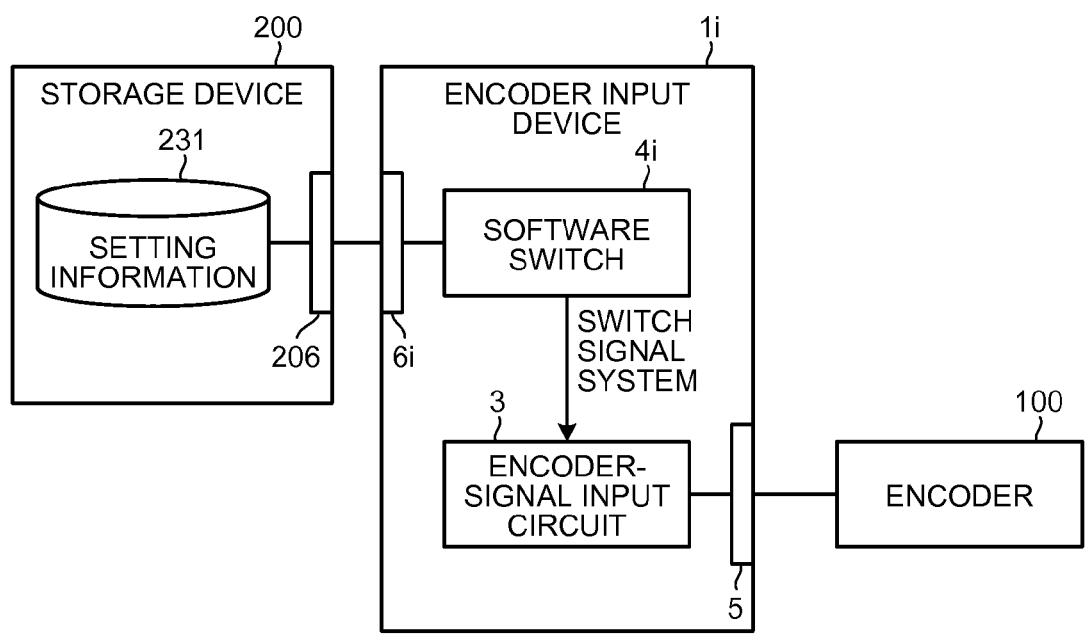
FIG. 7 is a diagram illustrating the configuration of an encoder input device in accordance with a second embodiment.

Specifically, as shown in FIG. 7, setting information 231 of a software switch 4i for switching a signal system of the encoder 100 is stored in a storage device 200 placed on the outside of the encoder input device 1i.

For example, the encoder input device 1i includes a connection interface 6i to connect the storage device 200 with the encoder input device 1i. When the connection interface 6i recognizes that the storage device 200 is connected, the connection interface 6i makes a communication with a connection interface 206 on the storage device 200 side.

For example, the connection interface 6i transmits information concerning the signal system of the encoder 100 received via the software switch 4i to the interface 206 to back up the information in the storage device 200. The information concerning the signal system of the encoder 100 is, for example, information indicating what kind of the signal system of the encoder 100 is connected to the connection terminal 5, which includes a differential system, a TTL system, and an open collector system (see FIG. 2). Consequently, the storage device 200 receives the information concerning the signal system of the encoder 100 in the connection interface 206 and stores and retains the information as the setting information 231.

Alternatively, for example, the connection interface 6i transmits information concerning a command values generated by the software switch 4i to the connection interface 206 to back up the information in the storage device 200. The information concerning the command values includes information indicating "LHH", "LHL", or "HLL", for example. Consequently, the storage device 200 receives the information concerning the command values in the connection interface 206 and stores and retains the information as the setting information 231.

When the encoder input device 1i is exchanged because of a failure or the like of the encoder input device 1i, the storage device 200 is connected to the exchanged encoder input device 1*i*. When the connection interface 6*i* recognizes that the storage device 200 is connected, the connection interface 6*i* makes a communication with the connection interface 206 on the side of the storage device 200, receives the setting information 231 from the storage device 200, and supplies the setting information 231 to the software switch 4*i*. The software switch 4*i* switches the connection arrangement between the connection terminal 5 and the power supplies for signals 14 to 16 (see FIG. 3) in accordance with the received setting information.

For example, when the setting information is the information concerning the signal system of the encoder 100, the software switch 4*i* refers to the conversion table 41 and generates commands for switching the signal systems on the basis of the information concerning the signal system of the encoder 100 and the conversion table 41.

Alternatively, for example, when the setting information is the information concerning the command values, the software switch 4*i* determines that it is unnecessary to refer to the conversion table 41 and generates commands for switching the signal system in accordance with the information concerning the command values.

As described above, in the second embodiment, the setting information 231 of the software switch 4*i* for switching the signal system of the encoder 100 is stored in the storage device 200 placed on the outside of the encoder input device 1*i*. Consequently, when the encoder input device 1*i* is exchanged because of a failure or the like of the encoder input device 1*i*, it is unnecessary to reset the signal system. Therefore, it is possible to easily exchange the encoder input device. Moreover, it is possible to prevent the encoder input device 1*i* and the encoder 100 from being damaged with broken by erroneous setting.

It should be noted that, in the above description, the circuit configuration capable of handling the three types of encoder signal systems by using the differential receiver and the FETs is described. However, the application of the present invention is not limited thereto. It should be appreciated that the present invention can be applied to other encoder signal systems and circuit configurations.

INDUSTRIAL APPLICABILITY

As described above, the encoder input device according to the present invention is useful for signal processing of an encoder.

REFERENCE SIGNS LIST 1, 1*i* Encoder input devices
2 Encoder-signal processing unit
3 Encoder-signal input circuit
4, 4*i* Software switches
5 Connection terminal
6*i* Connection interface
10 Differential receiver
11 to 13 FETs
14 to 16 Power supplies for signals
17, 19 Resistors
18 Rectifier diode
41 Conversion table
51 to 53 Terminals
100, 100*a* to 100*c* Encoders
105 Output terminal
151 to 153 Terminals
163 Transistor
200 Storage device
206 Connection interface
231 Setting information

The invention claimed is:

1. An encoder input device comprising:
a connection terminal configured to be connected to one of a plurality of encoders and made common to a plurality of different types of signal systems of the plurality of encoders configured to provide information about a position of a motor;
a plurality of power supplies which supply voltage for signals levels corresponding to the plurality of different types of signal systems of the plurality of encoders, respectively; and
a software switch that switches connection arrangement between the connection terminal and the power supplies according to the signal system of an encoder, of the plurality of encoders, which is currently connected to the connection terminal, among the plurality of different types of signal systems of the plurality of encoders, to supply, via the connection terminal, the signals levels peculiar to the signal system of the encoder currently connected to the connection terminal, wherein the power supplies supply the voltage of different levels to the encoders to support the plurality of different types of signal systems.

2. The encoder input device according to claim 1, wherein the encoder input device is connected to a storage device that stores setting information indicating switching values of the software switch, and
the software switch switches the connection arrangement between the connection terminal and the power supplies in accordance with the setting information.

3. The encoder input device according to claim 1, wherein the software switch switches the connection arrangement between the connection terminal and the power supplies for the signals levels corresponding to a differential system and an open collector system.

4. The encoder input device according to claim 1, wherein the software switch switches the connection arrangement between the connection terminal and the power supplies for the signals levels corresponding to a differential system and a transistor transistor logic (TTL) system.

5. The encoder input device according to claim 1, wherein the software switch switches the connection arrangement between the connection terminal and the power supplies for the signals levels corresponding to a transistor transistor logic (TTL) system and an open collector system.

6. The encoder input device according to claim 1, wherein the software switch switches the connection arrangement between the connection terminal and the power supplies for the signals levels corresponding to a differential system, a transistor transistor logic (TTL) system, and an open collector system.

7. The encoder input device according to claim 1, wherein the power supplies are configured to be connected to the software switch via respective control lines, and
the software switch is configured to switch the respective control lines of the power supplies, so that the signals levels in correspondence to the signal system of the connected encoder are provided to the connected encoder via the connection terminal.

8. The encoder input device according to claim 7, further including field-effect transistors (FETs) each connected between the connection terminal and a respective power supply, of the power supplies, and having a gate connected to the respective control line.

9. The encoder input device according to claim 1, wherein the connection terminal includes:
a first terminal configured to be connected to a first power supply and a second power supply, of the power supplies; and
a second terminal which is connected to ground.

10. The encoder input device according to claim 9, wherein the connection terminal further includes a third terminal configured to be connected to a third power supply and to ground via a resistor.

11. An encoder input device comprising:
a connection terminal configured to be connected to one of a plurality of encoders and made common to a plurality of types of signal systems of the plurality of encoders configured to provide information about a position of a motor;
a plurality of power supplies which supply voltage for signals levels corresponding to the plurality of types of signal systems of the plurality of encoders, respectively; and
a software switch that switches connection arrangement between the connection terminal and the power supplies according to the signal system of an encoder, of the plurality of encoders, which is currently connected to the connection terminal, among the plurality of types of signal systems of the plurality of encoders, to supply, via the connection terminal, the signals levels peculiar to the signal system of the encoder currently connected to the connection terminal, wherein the connection terminal includes:

a first terminal configured to be connected to a first power supply and a second power supply, of the power supplies;

a second terminal which is connected to ground; and a third terminal configured to be connected to a third power supply and to ground via a resistor.

* * * * *